United States Patent
Yamashita et al.

(10) Patent No.: US 10,734,502 B2
(45) Date of Patent: *Aug. 4, 2020

(54) PREVENTION OF EXTENSION NARROWING IN NANOSHEET FIELD EFFECT TRANSISTORS

(71) Applicant: INTERNATIONAL BUSINESS MACHINES CORPORATION, Armonk, NY (US)

(72) Inventors: Tenko Yamashita, Schenectady, NY (US); Chun W. Yeung, Niskayuna, NY (US); Chen Zhang, Guilderland, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/675,778

(22) Filed: Nov. 6, 2019

(65) Prior Publication Data

US 2020/0075744 A1 Mar. 5, 2020

Related U.S. Application Data

(63) Continuation of application No. 15/581,142, filed on Apr. 28, 2017, now Pat. No. 10,541,318.

(51) Int. Cl.

| | |
|---|---|
| *H01L 29/06* | (2006.01) |
| *H01L 29/66* | (2006.01) |
| *H01L 29/78* | (2006.01) |
| *B82Y 10/00* | (2011.01) |
| *H01L 29/775* | (2006.01) |

(Continued)

(52) U.S. Cl.
CPC .......... *H01L 29/6659* (2013.01); *B82Y 10/00* (2013.01); *H01L 29/0653* (2013.01); *H01L 29/0665* (2013.01); *H01L 29/0673* (2013.01); *H01L 29/42392* (2013.01); *H01L 29/6653* (2013.01); *H01L 29/66439* (2013.01); *H01L 29/66545* (2013.01); *H01L 29/775* (2013.01);

(Continued)

(58) Field of Classification Search
CPC ...................................................... H01L 29/06
See application file for complete search history.

(56) References Cited

U.S. PATENT DOCUMENTS

| | | |
|---|---|---|
| 7,476,578 B1 | 1/2009 | Cheng et al. |
| 8,174,055 B2 | 5/2012 | Bonser et al. |

(Continued)

OTHER PUBLICATIONS

Anoynomous, Improved Spacer for Nano Sheet Transistors, An IP.com Prior Art Database Technical Disclosure, Jan. 2016.

(Continued)

*Primary Examiner* — Lex H Malsawma
*Assistant Examiner* — Geoffrey H Ida
(74) *Attorney, Agent, or Firm* — Tutunjian & Bitetto, P.C.; Vazken Alexanian

(57) ABSTRACT

Semiconductor devices include semiconductor layers and a gate stack formed on and around the semiconductor layers. Spacers are formed between vertically adjacent semiconductor layers, each spacer having a first spacer layer and a second spacer layer. The first spacer layer is positioned between the gate stack and the second spacer layer. The second spacer layer of each spacer has a trapezoidal cross-section.

20 Claims, 8 Drawing Sheets

(51) Int. Cl.
   *H01L 29/423*     (2006.01)
   *H01L 29/786*     (2006.01)
(52) U.S. Cl.
   CPC ........ *H01L 29/785* (2013.01); *H01L 29/7833* (2013.01); *H01L 29/78696* (2013.01)

(56) References Cited

U.S. PATENT DOCUMENTS

| | | |
|---|---|---|
| 8,716,797 B2 | 5/2014 | Basker et al. |
| 9,461,114 B2 | 10/2016 | Obradovic et al. |
| 9,508,829 B1 | 11/2016 | Cheng et al. |
| 9,515,138 B1 | 12/2016 | Doris et al. |
| 2016/0071729 A1 | 3/2016 | Hatcher et al. |
| 2016/0126310 A1 | 5/2016 | Rodder et al. |
| 2016/0155800 A1* | 6/2016 | Zang .................. H01L 29/0673 257/347 |
| 2016/0240681 A1 | 8/2016 | Ching et al. |
| 2017/0012053 A1 | 1/2017 | Sun et al. |

OTHER PUBLICATIONS

U.S. Office Action issued in U.S. Appl. No. 15/805,769 dated Jul. 12, 2018, 14 pages.
U.S. Final Office Action issued in U.S. Appl. No. 15/805,769 dated Feb. 7, 2019, 16 pages.
List of IBM Patents or Patent Applications Treated as Related dated Nov. 6, 2019, 2 pages.

* cited by examiner

US 10,734,502 B2

PREVENTION OF EXTENSION NARROWING IN NANOSHEET FIELD EFFECT TRANSISTORS

BACKGROUND

Technical Field

The present invention generally relates to semiconductor device fabrication and, more particularly, to the fabrication of nanosheet devices with source/drain extensions.

Description of the Related Art

As complementary metal-oxide semiconductor (CMOS) fabrication processes have improved and scaled down, the structures involved have reached nanometer scales. Various different nano-scale device architectures have been used to push the boundaries of CMOS technologies, including in particular nanosheet devices that use sheets of channel material having thicknesses measured in nanometers.

In particular, stacked sheets of alternating materials may be used to form semiconductor nanosheets. Forming source and drain extensions for such structures can involve recessing one set of sheets relative to the other to help form an inner spacer, which beneficially reduces the parasitic capacitance between the gate and the source/drain structure. However, if the etch selectivity between the two materials is imperfect, the channel material can be narrowed, resulting in a narrowing of the source/drain extension region. Such narrowing can be detrimental to the current capacity of the device.

SUMMARY

A semiconductor device includes multiple semiconductor layers and a gate stack formed on and around the semiconductor layers. Spacers are formed between vertically adjacent semiconductor layers, each spacer having a first spacer layer and a second spacer layer. The first spacer layer is positioned between the gate stack and the second spacer layer. The second spacer layer of each spacer has a trapezoidal cross-section.

A semiconductor device includes multiple semiconductor layers and a gate stack formed on and around the semiconductor layers. Spacers are formed between vertically adjacent semiconductor layers. Each spacer includes a first spacer layer and a second spacer layer. The first spacer layer is positioned between the gate stack and the second spacer layer and directly on a sidewall of the gate stack. The second spacer layer of each spacer has a trapezoidal cross-section and is disposed directly on a sidewall of a respective first spacer layer.

A semiconductor device includes multiple semiconductor layers. A gate stack is formed on and around the plurality of semiconductor layers. Spacers are formed between vertically adjacent semiconductor layers. Each spacer includes a first spacer layer and a second spacer layer. The first spacer layer is positioned between the gate stack and the second spacer layer and directly on a sidewall of the gate stack. The second spacer layer of each spacer has a trapezoidal cross-section and is disposed directly on a sidewall of a respective first spacer layer. At least a portion of at least one of the first spacer layer of each spacer is formed between vertically adjacent semiconductor layers.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide nanosheet field effect transistors (FETs) that include inner spacers that do not cause narrowing of the interface between the source/drain extensions and the semiconductor nanosheet channels. To accomplish this, two inner spacers are formed with one of the inner spacers being partially etched away to enlarge the space available for forming the source/drain extension structures.

Figure 1:
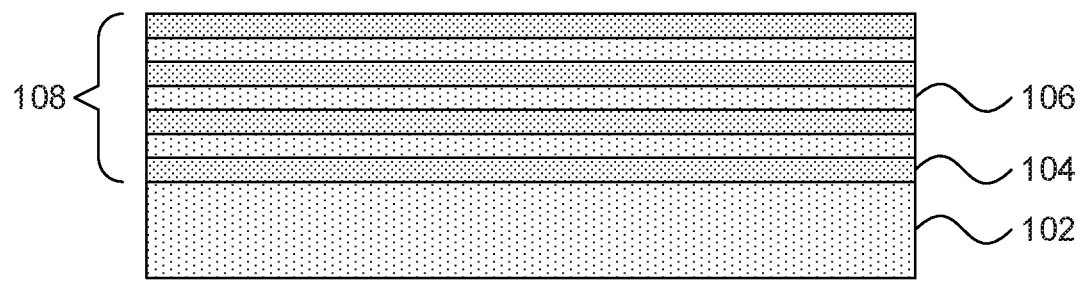
FIG. 1 is a cross-sectional view of a step in the formation of a semiconductor device having inner spacers without narrowed source/drain extensions in accordance with an embodiment of the present invention.

Referring now to the drawings in which like numerals represent the same or similar elements and initially to FIG. 1, a cross-sectional diagram of a step in forming nanosheet FETs is shown. A semiconductor substrate 102 is provided. The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted herein, the semiconductor substrate 102 may also be a semiconductor on insulator (SOI) substrate.

A stack of alternating semiconductor layers 108 is formed on the semiconductor substrate 102. The stack 108 may be formed directly on the semiconductor substrate 102 (as shown) or may, in alternative embodiments, be separated from the underlying substrate 102 by an isolation dielectric layer (not shown). Sacrificial layers 104 formed from a first material alternate with channel layers 106 formed from a second material. The first and second materials have etch selectivity with respect to one another. As used herein, the term "selective" in reference to a material removal process denotes that the rate of material removal for a first material is greater than the rate of removal for at least another material of the structure to which the material removal process is being applied.

The stack 108 may be formed from nanosheet layers of the respective materials. As used herein, a "nanosheet" is a sheet of material having a ratio between its thickness and its width of no less than 1:2. Although the present embodiments are specifically described with respect to nanosheet structures, it should be understood that nanowires, having a thickness-to-width ratio of 1:2 or less, may be used instead.

In one specific embodiment, the sacrificial layers 104 are formed from silicon germanium and the channel layers 106 are formed from silicon. More specifically, the sacrificial layers 104 may be formed from silicon germanium having a germanium concentration of about 20%. These two materials have imperfect etch selectivity with respect to one another, removing the material of one set of layers does result in the removal of some material from the other layers. It should be understood, however, that any appropriate combination of semiconductor materials having any reasonable degree of etch selectivity with respect to one another may be used instead.

The stack of alternating semiconductor layers 108 may be formed by any appropriate deposition process, including for example chemical vapor deposition (CVD), atomic layer deposition (CVD), physical vapor deposition (PVD), and gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 2:
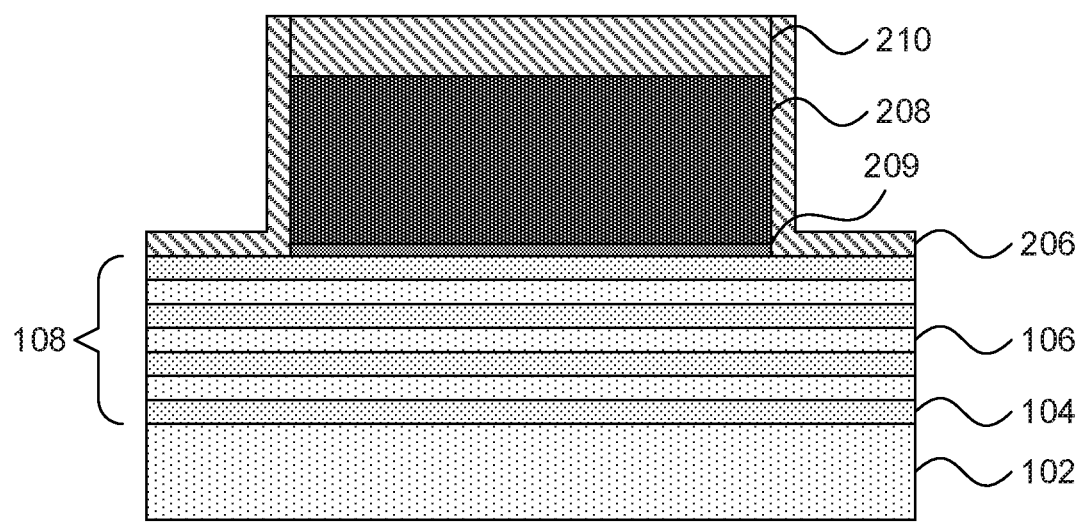
FIG. 2 is a cross-sectional view of a step in the formation of a semiconductor device having inner spacers without narrowed source/drain extensions in accordance with an embodiment of the present invention.

Referring now to FIG. 2, a cross-sectional diagram of a step in forming nanosheet FETs is shown. Dummy gate 208 is formed in the respective regions and may be formed from any appropriate material such as, e.g., polysilicon or amorphous silicon and are separated from the underlying stack of alternating semiconductor layers 108 by an insulator pad 209. The dummy gate 208 is surrounded by an insulator layer formed from, e.g., a gate pattern hardmask 210 and a spacer 206. It is specifically contemplated that the gate pattern hardmask 210 may be formed from any appropriate hardmask material such as, e.g., silicon nitride, and that the spacer 206 may be formed from any appropriate dielectric material including, e.g., silicon boron carbon nitride. It should be noted that the materials of the spacer 206 and the hardmask 210 should be selectively etchable with respect to one another.

The dummy gate 208 may be formed by depositing a dielectric hard mask material, such as silicon nitride or silicon dioxide, on a layer of dummy gate material and then applying a photoresist pattern to the hard mask material using a lithography process. The photoresist pattern is then transferred into the hard mask material using, e.g., a dry etch process to form the gate pattern hardmask 210. Next, the photoresist pattern is removed and the gate pattern is then transferred into the dummy gate material during an anisotropic selective etching process, such as reactive ion etching (RIE). Alternatively, the dummy gate 208 can be formed by other patterning techniques such as spacer image transfer.

RIE is a form of plasma etching in which during etching the surface to be etched is placed on a radio-frequency powered electrode. During RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 3:
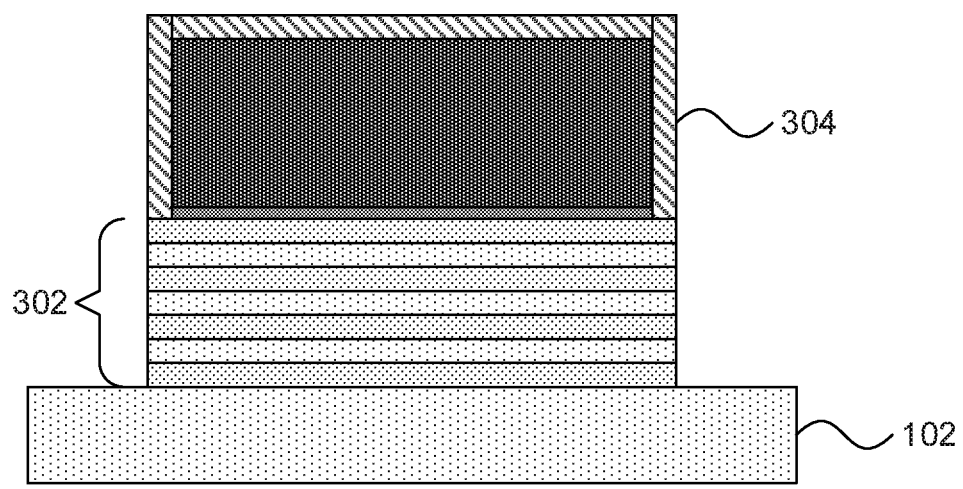
FIG. 3 is a cross-sectional view of a step in the formation of a semiconductor device having inner spacers without narrowed source/drain extensions in accordance with an embodiment of the present invention.

Referring now to FIG. 3, a cross-sectional diagram of a step in forming nanosheet FETs having different channel properties. An anisotropic etch is applied that stops on the substrate 102. The anisotropic etch should remove material from the spacer 206, such that it can penetrate to the underlying stack of layers 108, but should etch the stack of semiconductor layers 108 at a rate greater than the rate at which it etches the spacer 206 and the hardmask 210. This prevents the etch from damaging the dummy gate 208.

It is specifically contemplated that RIE may be used to perform the anisotropic etch. In one specific embodiment, multiple different etches may be used, with a first etch anisotropically removing material to remove material around the thicker gate pattern hardmask 206 and vertical spacer, followed by a second etch that is selective to the materials of the stack 108 without affecting the remaining hardmask materials. What remains is etched channel stacks 302 that extend no farther than the remaining gate spacers 304.

Figure 4:
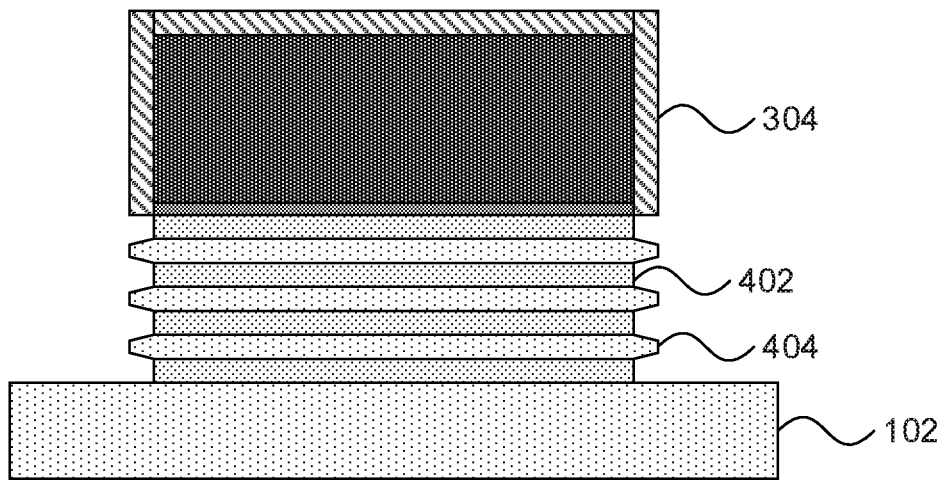
FIG. 4 is a cross-sectional view of a step in the formation of a semiconductor device having inner spacers without narrowed source/drain extensions in accordance with an embodiment of the present invention.

Referring now to FIG. 4, a cross-sectional diagram of a step in forming nanosheet FETs is shown. An isotropic etch is used to laterally etch the sacrificial layers 104. The etch selectively removes material from the sacrificial layers 104, producing recessed sacrificial layers 402. However, because of imperfect etch selectivity between the sacrificial layers 104 and the channel layers 106, tapered channel layers 404 remain.

Figure 5:
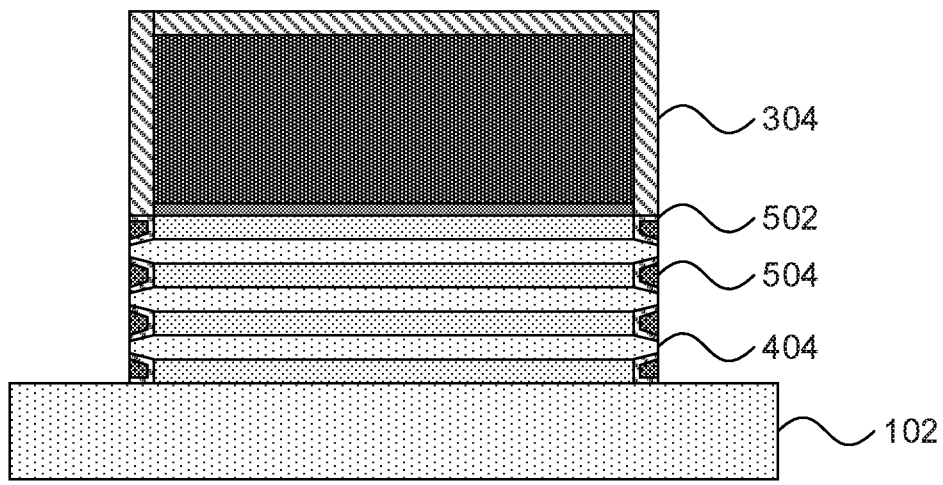
FIG. 5 is a cross-sectional view of a step in the formation of a semiconductor device having inner spacers without narrowed source/drain extensions in accordance with an embodiment of the present invention.

Referring now to FIG. 5, a cross-sectional diagram of a step in forming nanosheet FETs is shown. A first inner spacer 502 and a second inner spacer 504 are formed in the recesses of the recessed sacrificial layers 104. The first inner spacer can be deposited by a conformal deposition process of a first dielectric layer. A second dielectric layer is then conformally formed over the structures. It is specifically contemplated that the deposition process of the second dielectric layer will pinch off the recessed space. The first and second dielectric layers are etched away by an isotropic etch process. The etch time is controlled such that the spacer materials in the recesses remain after etch. In one specific example, CVD may be used to form the dielectric material. It is specifically contemplated that the first inner spacer 502 may be formed from, e.g., silicon nitride and that the second inner spacer 504 may be formed from, e.g., silicon oxycarbide (SiOC), but any two dielectric materials having appropriate etch selectivity with respect to one another may be used instead. In one particular embodiment the first spacer 502 has an exemplary thickness of about 2 nm and the second spacer 504 has an exemplary thickness of about 5 nm.

Figure 6:
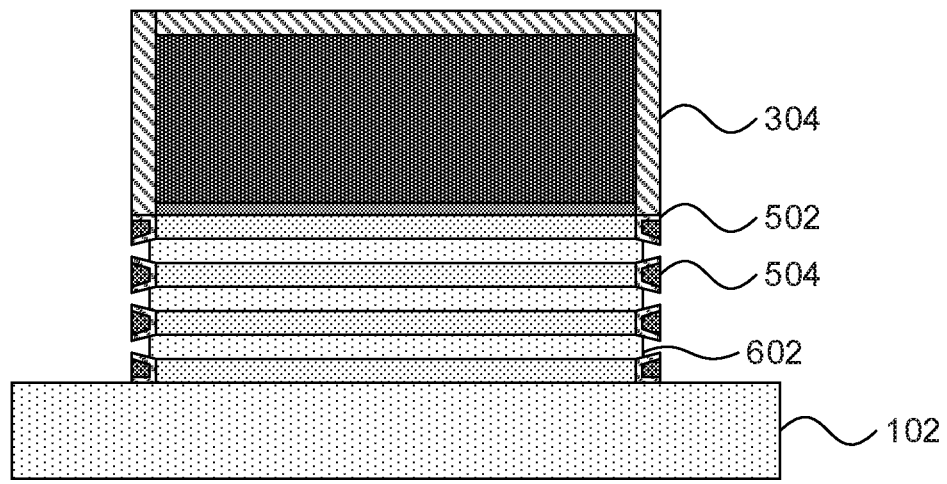
FIG. 6 is a cross-sectional view of a step in the formation of a semiconductor device having inner spacers without narrowed source/drain extensions in accordance with an embodiment of the present invention.

Referring now to FIG. 6, a cross-sectional diagram of a step in forming nanosheet FETs is shown. In this embodiment, the tapered channel layers 404 are recessed with an appropriate selective, isotropic etch to produce recessed channel layers 602. The sidewalls of the first spacer 502 are exposed by this etch.

Figure 7:
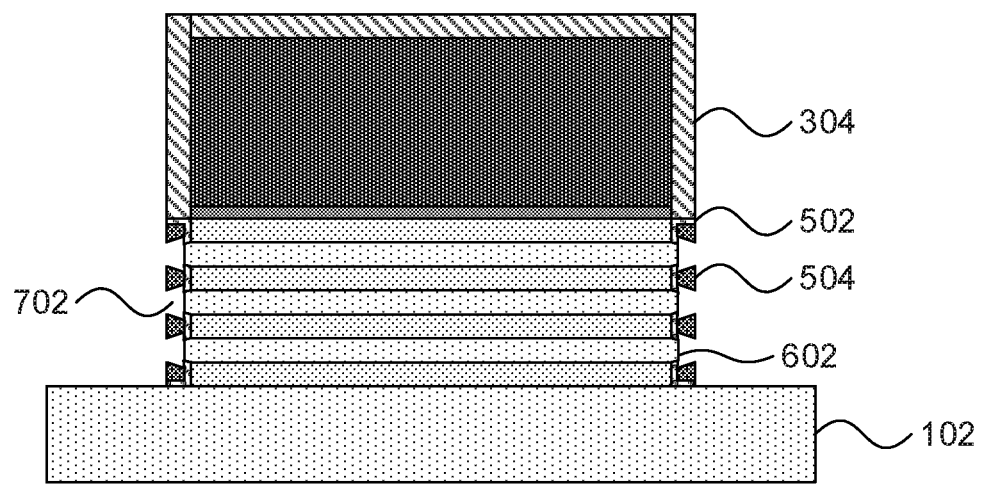
FIG. 7 is a cross-sectional view of a step in the formation of a semiconductor device having inner spacers without narrowed source/drain extensions in accordance with an embodiment of the present invention.

Referring now to FIG. 7, a cross-sectional diagram of a step in forming nanosheet FETs is shown. The exposed portions of the first spacer 502 are isotropically etched away, expanding the cavities 702. By removing the first spacers 502 from these surfaces, the width of the cavities 702 is increased by twice the thickness of the first spacers 502.

Figure 8:
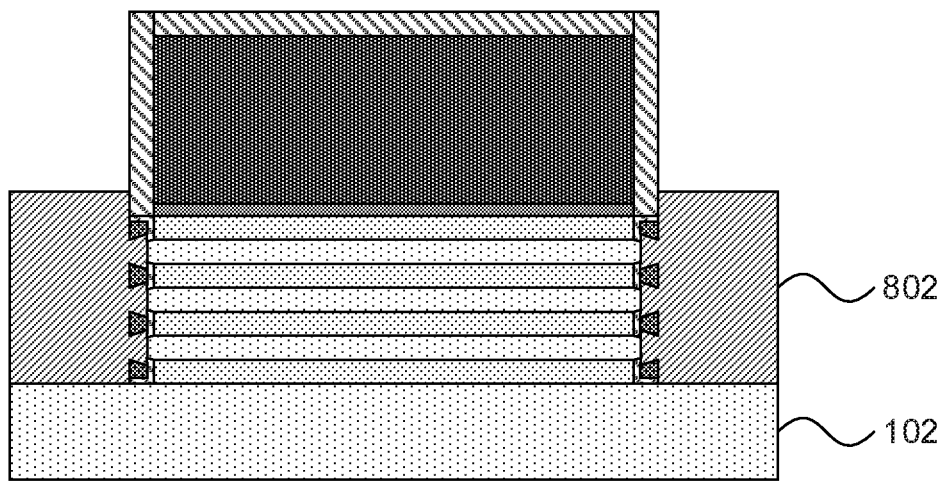
FIG. 8 is a cross-sectional view of a step in the formation of a semiconductor device having inner spacers without narrowed source/drain extensions in accordance with an embodiment of the present invention.

Referring now to FIG. 8, a cross-sectional diagram of a step in forming nanosheet FETs is shown. Source/drain extensions 802 are formed at the exposed ends of the recessed channel layers 602. In some embodiments, the source/drain extensions 802 may be formed by epitaxially growing semiconductor material from the exposed ends of the recessed channel layers 602. The source/drain extensions 802 fill the cavities 702. Notably the expansion of the cavities prevent constriction of the current that would have otherwise resulted from the tapering of the channels. As can be seen from the figure, the portions of the source/drain extensions 802 that meet the recessed channel layers 602 have a roughly trapezoidal cross-section.

The term "epitaxial growth" herein refers to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Source/drain epitaxy can be performed by ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE), etc. Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial semiconductor materials can be doped during deposition (in situ doped) by adding dopants, such as n-type dopants (e.g., phosphorus or arsenic) or p-type dopants (e.g., boron or gallium), depending on the type of transistor. The dopant concentration in the source/drain can range from about $1\times10^{19}$ $cm^{-3}$ to about $2\times10^{21}$ $cm^{-3}$, or preferably between $2\times10^{20}$ $cm^{-3}$ and $1\times10^{21}$ $cm^{3}$.

Figure 9:
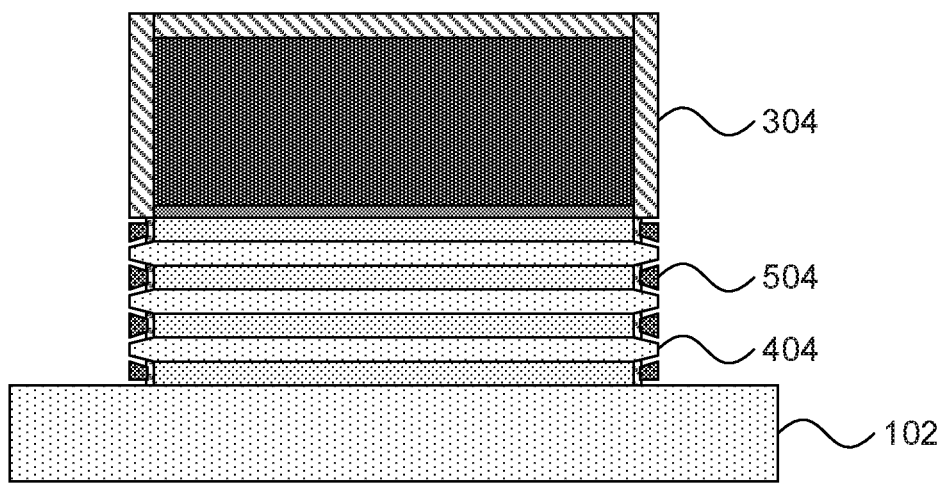
FIG. 9 is a cross-sectional view of a step in the formation of a semiconductor device having inner spacers without narrowed source/drain extensions in accordance with an alternative embodiment of the present invention.

Referring now to FIG. 9, a cross-sectional diagram of a step in forming an alternative embodiment of nanosheet FETs is shown. This alternative step occurs after the formation of the first spacer 502 and the second spacer 504 in FIG. 5. Without recessing the tapered channel layers 404, the first spacer 502 is etched back using an isotropic etch. Portions of the first spacers 502 remains unetched behind the second spacers 504.

Figure 10:
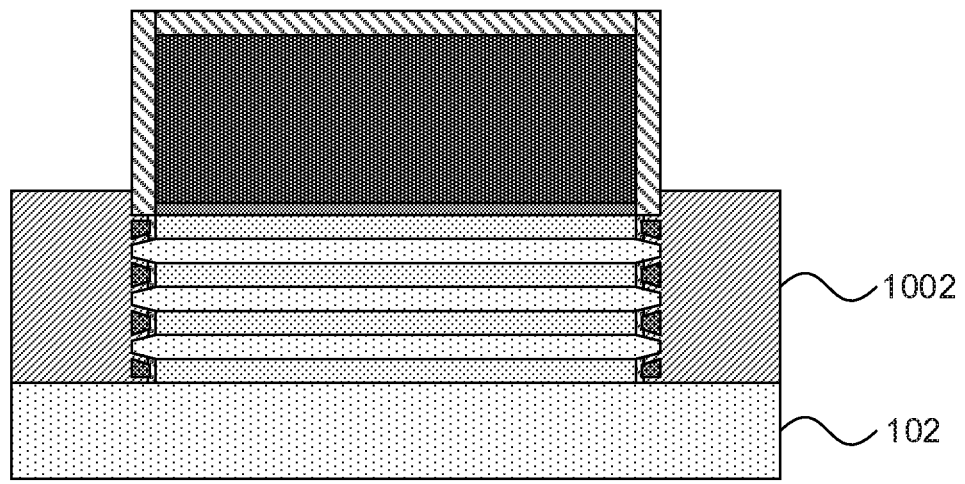
FIG. 10 is a cross-sectional view of a step in the formation of a semiconductor device having inner spacers without narrowed source/drain extensions in accordance with an alternative embodiment of the present invention.

Referring now to FIG. 10, a cross-sectional diagram of a step in forming an alternative embodiment of nanosheet FETs is shown. Source/drain extensions 1002 are formed at the exposed ends of the tapered channel layers 404. In some embodiments, the source/drain extensions 1002 may be formed by epitaxially growing semiconductor material from the exposed ends of the tapered channel layers 402. The source/drain extensions 1002 fill the space that was created by etching back the first spacer 502. Notably, forming the source/drain extensions 1002 in this space prevents constriction of the current that would have otherwise resulted from the tapering of the channels.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, it will also be understood that when a layer is referred to as being "between" t layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 11:
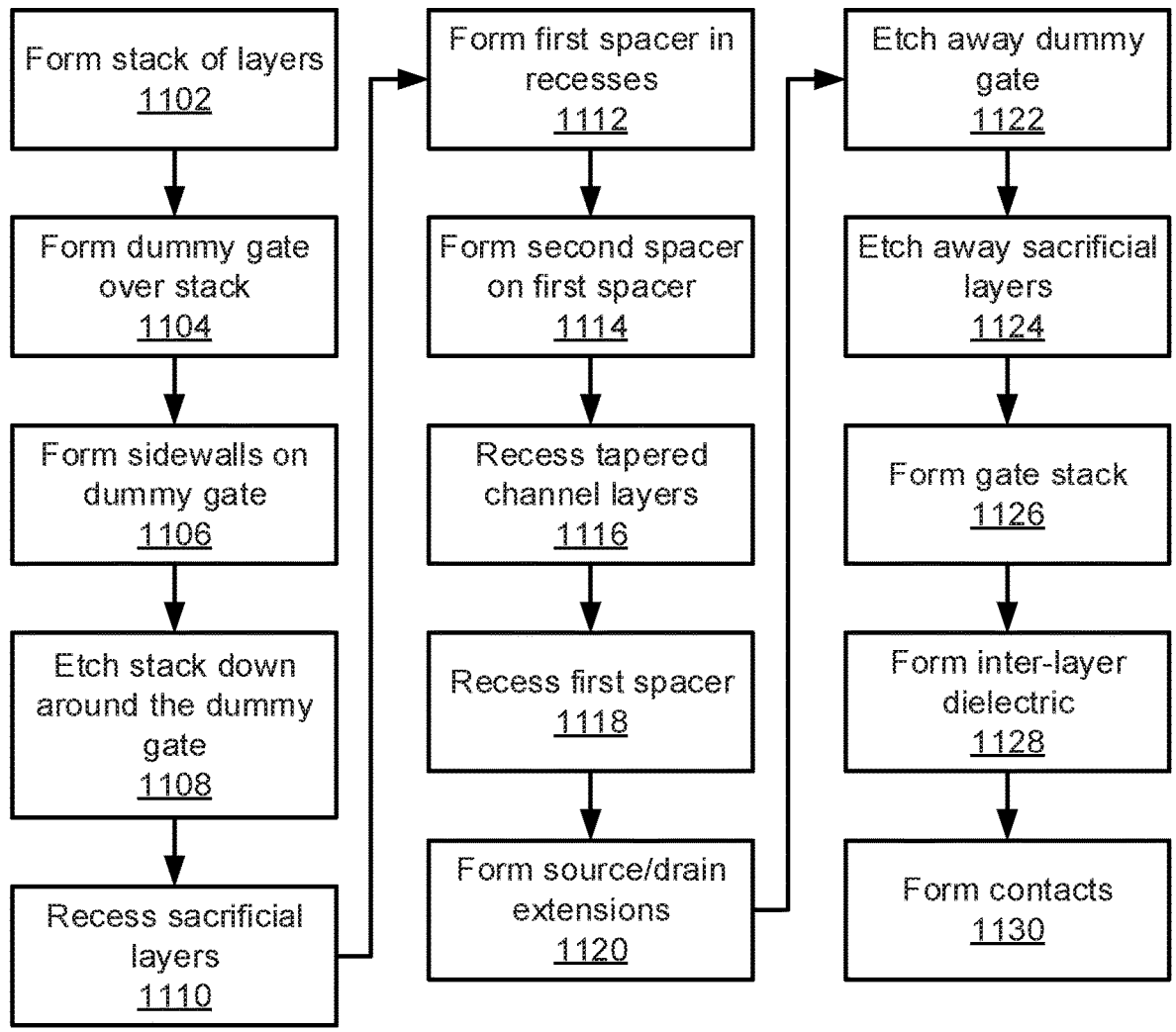
FIG. 11 is a block/flow diagram of a fabrication process for a semiconductor device having inner spacers without narrowed source/drain extensions in accordance with an embodiment of the present invention.

Referring now to FIG. 11, a method of forming nanochannel FETs is shown. Block 1102 forms a stack of layers 108 that includes sacrificial layers 104 and channel layers 106 on a semiconductor substrate 102. Block 1104 forms deposits a dummy gate material (e.g., polysilicon or amorphous silicon) on the stack of layers 108 and patterns the dummy gate material to form a dummy gate 208 using gate pattern hardmask 210. Block 1106 forms sidewalls 304 on the dummy gate by conformally depositing a layer of dielectric material 206 and then anisotropically etching away such dielectric material as remains on horizontal surfaces.

Block 1108 anisotropically etches the sacrificial layers 104 and the channel layers 106 in regions not covered by the sidewalls 302 and the gate pattern hardmask 210 to form etched stack 302. Block 1110 uses an isotropic etch to selectively recess the sacrificial layers 106 to produce recessed sacrificial layers 402. It is specifically contemplated that this etch may not be perfectly selective between the sacrificial material and the channel material, for example in an embodiment where the sacrificial layers 104 are formed from silicon germanium with a germanium concentration of about 20% and where the channel layers 106 are formed from silicon. The etch of block 1110 therefore will partially etch the ends of the channel layers 106, producing tapered channel layers 404.

Block 1112 forms first spacers 502 in the recesses formed by block 1110. The first spacers 502 may be formed by conformally depositing a first dielectric material, such as silicon nitride, at an exemplary thickness of about 2 nm. Block 1114 forms second spacers 504 by conformally depositing a selectively etchable second dielectric material, such as silicon oxycarbide, over the first dielectric material. The layers of first and second dielectric material fill the recesses. The two layers are then etched back from the external surfaces of the stack with, for example, an isotropic etch. The first spacers 502 and second spacers 502 are protected by their positions within the recesses, such that these inner spacer structures remain.

Block 1116 recesses the tapered channel layers 404 to form recessed channel layers 602. This etch exposes sidewalls of the first spacers 502. Block 1118 then etches back the first spacers 502 to expose the sidewalls of the second spacers 504. The etch of block 1118 expands the gaps left by recessing the tapered channel layers 404 to form cavities 702. Block 1120 then forms source/drain extensions 802 by, e.g., epitaxial growth from the exposed ends of the recessed channel layers 602. The source/drain extensions fill the expanded cavities 702, such that the partial etching of the channel layers 106 when to form the recessed sacrificial layers 402 does not limit the width of the source/drain extensions 802.

The device can then be completed by, e.g., a replacement metal gate process. The dummy gate 208 is etched away in block 1122, along with the dummy gate dielectric 209. The recessed sacrificial layers 402 are also etched away in block 1124 using any appropriate isotropic etch, freeing the recessed channel layers 602 and leaving said recessed channel layers 602 suspended at their ends by the source/drain extensions 802. Block 1126 then forms a gate stack over, between, and around the channel layers 602, including a gate dielectric and a gate conductor. Block 1128 forms an inter-layer dielectric over the source/drain extensions 802 and the gate stack and block 1130 forms conductive contacts through the inter-layer dielectric to form electrical connections with the gate conductor and with the source/drain extensions 802.

Figure 12:
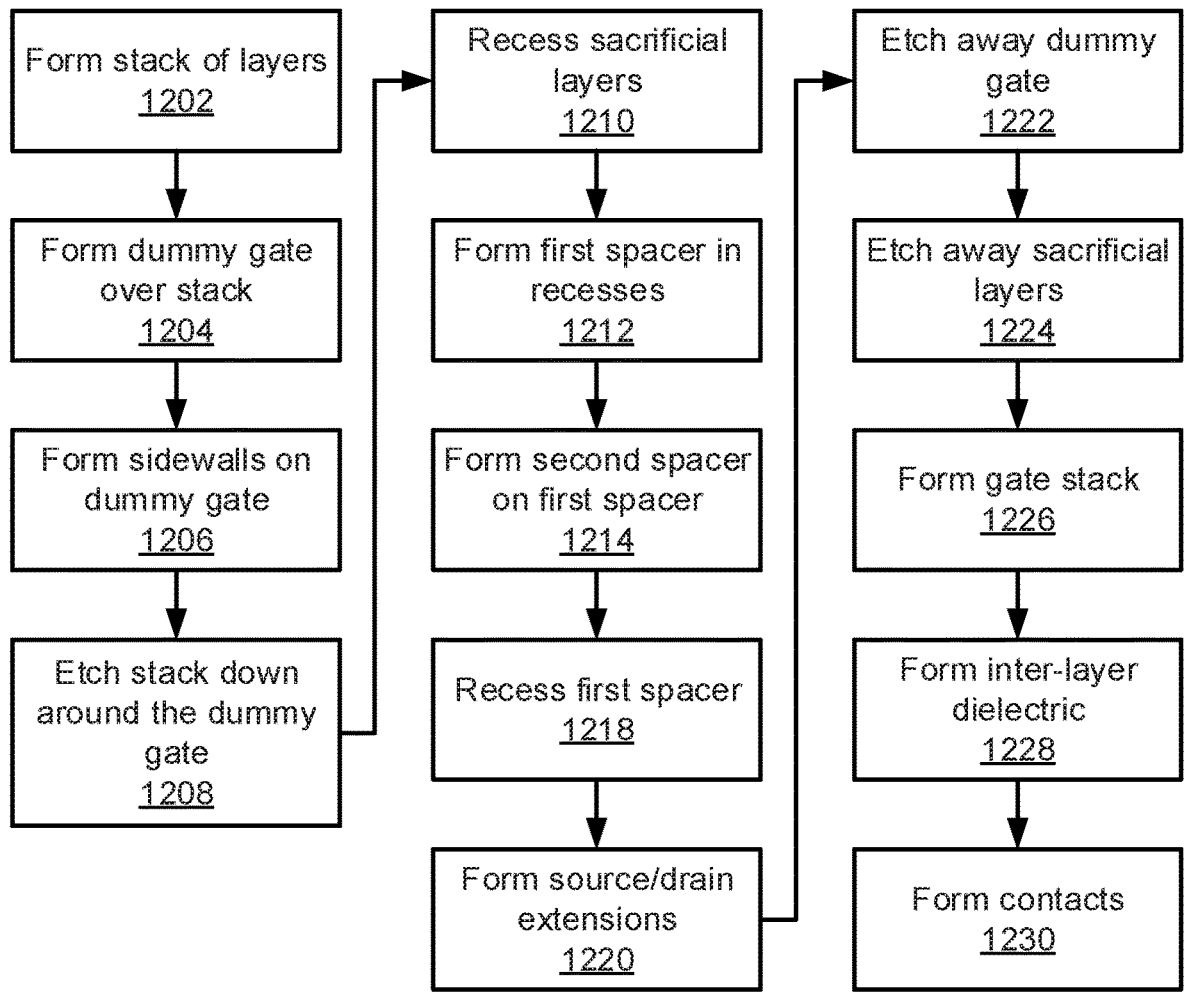
FIG. 12 is a block/flow diagram of a fabrication process for a semiconductor device having inner spacers without narrowed source/drain extensions in accordance with an alternative embodiment of the present invention.

Referring now to FIG. 12, an alternative method of forming nanochannel FETs is shown. Block 1202 forms a stack of layers 108 that includes sacrificial layers 104 and channel layers 106 on a semiconductor substrate 102. Block 1204 forms deposits a dummy gate material (e.g., polysilicon or amorphous silicon) on the stack of layers 108 and patterns the dummy gate material to form a dummy gate 208 using gate pattern hardmask 210. Block 1206 forms sidewalls 304 on the dummy gate by conformally depositing a layer of dielectric material 206 and then anisotropically etching away such dielectric material as remains on horizontal surfaces.

Block 1208 anisotropically etches the sacrificial layers 104 and the channel layers 106 in regions not covered by the sidewalls 302 and the gate pattern hardmask 210 to form etched stack 302. Block 1210 uses an isotropic etch to selectively recess the sacrificial layers 106 to produce recessed sacrificial layers 402. It is specifically contemplated that this etch may not be perfectly selective between the sacrificial material and the channel material, for example in an embodiment where the sacrificial layers 104 are formed from silicon germanium with a germanium concentration of about 20% and where the channel layers 106 are formed from silicon. The etch of block 1210 therefore will partially etch the ends of the channel layers 106, producing tapered channel layers 404.

Block 1212 forms first spacers 502 in the recesses formed by block 1210. The first spacers 502 may be formed by conformally depositing a first dielectric material, such as silicon nitride, at an exemplary thickness of about 2 nm. Block 1214 forms second spacers 504 by conformally depositing a selectively etchable second dielectric material, such as silicon oxycarbide, over the first dielectric material. The layers of first and second dielectric material fill the recesses. The two layers are then etched back from the external surfaces of the stack with, for example, an isotropic etch. The first spacers 502 and second spacers 502 are protected by their positions within the recesses, such that these inner spacer structures remain.

Block 1218 then etches back the first spacers 502 to expose the sidewalls of the second spacers 504. The etch of block 1218 creates a gap around the tapered channel layers 404. Block 1220 then forms source/drain extensions 1002 by, e.g., epitaxial growth from the exposed ends of the tapered channel layers 404. The source/drain extensions fill the expanded cavities 702, such that the partial etching of the channel layers 106 when to form the recessed sacrificial layers 402 does not limit the width of the source/drain extensions 802.

The device can then be completed by, e.g., a replacement metal gate process. The dummy gate 208 is etched away in block 1222, along with the dummy gate dielectric 209. The recessed sacrificial layers 402 are also etched away in block 1224 using any appropriate isotropic etch, freeing the tapered channel layers 404 and leaving said tapered channel layers 404 suspended at their ends by the source/drain extensions 1002. Block 1226 then forms a gate stack over, between, and around the channel layers 404, including a gate dielectric and a gate conductor. Block 1228 forms an inter-layer dielectric over the source/drain extensions 1002 and the gate stack and block 1230 forms conductive contacts through the inter-layer dielectric to form electrical connections with the gate conductor and with the source/drain extensions 1002.

Figure 13:
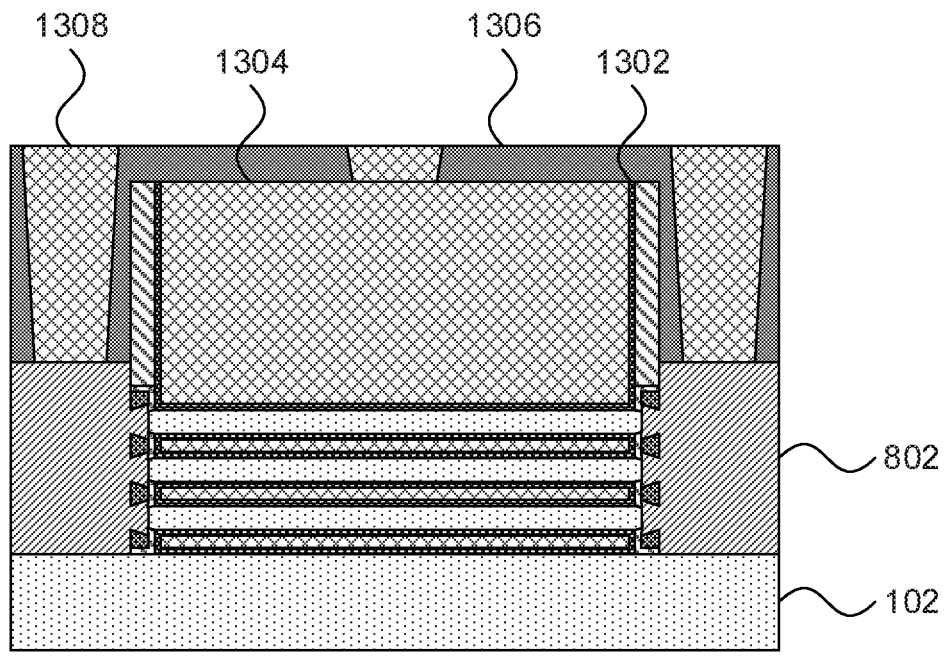
FIG. 13 is a cross-sectional view of a semiconductor device having inner spacers without narrowed source/drain extensions in accordance with an embodiment of the present invention.

Referring now to FIG. 13, a finished transistor device is shown in accordance with one embodiment of the present invention. This embodiment shows a gate dielectric 1302 and gate conductor 1304 being formed on and around the recessed channels 602. Inter-later dielectric 1306 is formed over the source/drain extensions 802, with conductive contacts 1308 being formed to penetrate the inter-layer dielectric 1306 and make electrical connections with the source/drain extensions 802 and the gate conductor 1304.

The gate dielectric 1302 may be formed from any appropriate dielectric material, such as a high-k dielectric material. As used herein, the term "high-k" refers to a dielectric material having a dielectric constant k that is higher than the dielectric constant of silicon dioxide. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric material may further include dopants such as lanthanum and aluminum.

The gate conductor 1304 may be formed from any appropriate conductive material. Exemplary conductive materials include conductive metals, such as tungsten, nickel, titanium, molybdenum, tantalum, copper, platinum, silver, gold, ruthenium, iridium, rhenium, and rhodium, as well as alloys of such metals. Non-metallic conductors may also be used, including for example doped polysilicon, doped polysilicon-germanium alloy materials, and polycide materials formed from stacked doped polysilicon and metal silicides.

The inter-layer dielectric 1306 may be formed from any appropriate dielectric material, with silicon dioxide being specifically contemplated. Vias are formed in the inter-layer dielectric 1306 that penetrate down to the underlying structure, such that conductive contacts 1308 may be formed. The conductive contacts 1308 may be formed from any appropriate conductive material, such as those described above.

Figure 14:
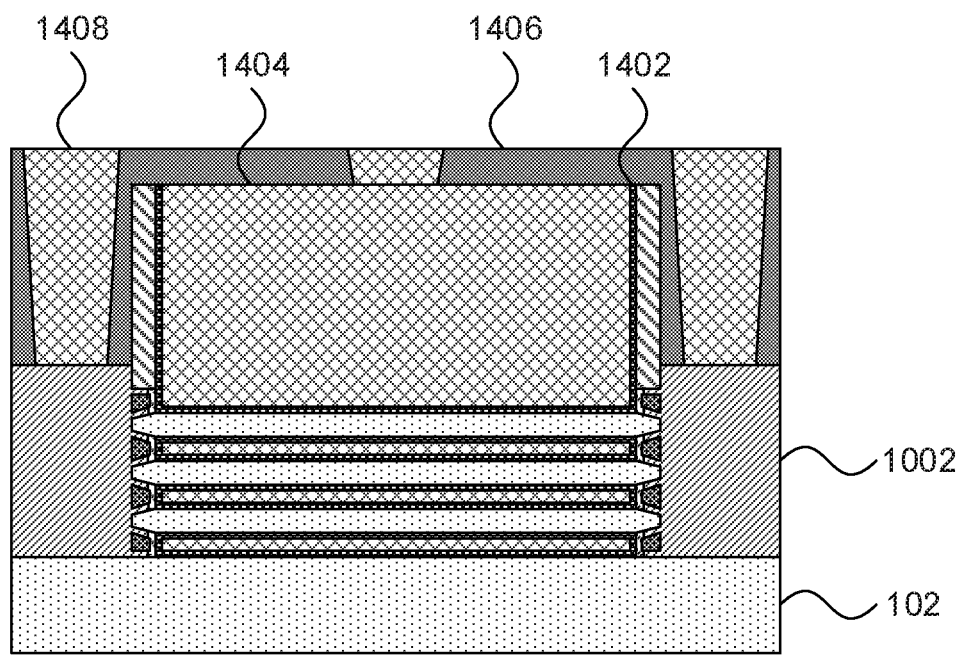
FIG. 14 is a cross-sectional view of a semiconductor device having inner spacers without narrowed source/drain extensions in accordance with an alternative embodiment of the present invention.

Referring now to FIG. 14, a finished transistor device is shown in accordance with one embodiment of the present invention. This embodiment shows a gate dielectric 1402 and gate conductor 1404 being formed on and around the tapered channels 404. Inter-later dielectric 1406 is formed over the source/drain extensions 1002, with conductive contacts 1408 being formed to penetrate the inter-layer dielectric 1406 and make electrical connections with the source/drain extensions 1002 and the gate conductor 1404. The gate dielectric 1402, gate conductor 1404, inter-layer dielectric 1406, and conductive contacts 1408 may be formed in a manner similar to that described above with respect to FIG. 13.

Having described preferred embodiments of preventing extension narrowing in nanosheet field effect transistors (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
a plurality of semiconductor layers;
a gate stack formed on and around the plurality of semiconductor layers; and
spacers formed between vertically adjacent semiconductor layers, each spacer comprising a first spacer layer and a second spacer layer, the first spacer layer being positioned between the gate stack and the second spacer layer, and the second spacer layer of each spacer having a trapezoidal cross-section.

2. The semiconductor device of claim 1, wherein the plurality of semiconductor layers have tapered ends that align horizontally with ends of the spacers.

3. The semiconductor device of claim 2, further comprising source and drain extensions that fill a space between the tapered ends of the semiconductor layers and the spacers.

4. The semiconductor device of claim 1, wherein the plurality of semiconductor layers are recessed with respect to the spacers.

5. The semiconductor device of claim 4, further comprising source and drain extensions that fill a space between the second spacer layer of vertically adjacent spacers.

6. The semiconductor device of claim 5, wherein portions of the source and drain extensions on the plurality of semiconductor layers have a trapezoidal cross-section.

7. The semiconductor device of claim 4, wherein a portion of first spacer layer remains on an upper surface of the uppermost spacers and wherein a portion of first spacer layer remains on a lower surface of the lowermost spacers.

8. The semiconductor device of claim 1, wherein the first spacer layer of each spacer is disposed directly on a sidewall of the gate stack.

9. The semiconductor device of claim 8, wherein the second spacer layer of each spacer is disposed directly on a sidewall of a respective first spacer layer.

10. The semiconductor device of claim 1, wherein at least a portion of at least one of the first spacer layer of each spacer is formed between vertically adjacent semiconductor layers.

11. A semiconductor device, comprising:
a plurality of semiconductor layers;
a gate stack formed on and around the plurality of semiconductor layers; and
spacers formed between vertically adjacent semiconductor layers, each spacer comprising a first spacer layer and a second spacer layer, the first spacer layer being positioned between the gate stack and the second spacer layer and directly on a sidewall of the gate stack, and the second spacer layer of each spacer having a trapezoidal cross-section and being disposed directly on a sidewall of a respective first spacer layer.

12. The semiconductor device of claim 11, wherein the plurality of semiconductor layers have tapered ends that align horizontally with ends of the spacers.

13. The semiconductor device of claim 12, further comprising source and drain extensions that fill a space between the tapered ends of the semiconductor layers and the spacers.

14. The semiconductor device of claim 11, wherein the plurality of semiconductor layers are recessed with respect to the spacers.

15. The semiconductor device of claim 14, further comprising source and drain extensions that fill a space between the second spacer layer of vertically adjacent spacers.

16. The semiconductor device of claim 15, wherein portions of the source and drain extensions on the plurality of semiconductor layers have a trapezoidal cross-section.

17. The semiconductor device of claim 14, wherein a portion of first spacer layer remains on an upper surface of the uppermost spacers and wherein a portion of first spacer layer remains on a lower surface of the lowermost spacers.

18. The semiconductor device of claim 11, wherein at least a portion of at least one of the first spacer layer of each spacer is formed between vertically adjacent semiconductor layers.

19. A semiconductor device, comprising:
a plurality of semiconductor layers;
a gate stack formed on and around the plurality of semiconductor layers; and
spacers formed between vertically adjacent semiconductor layers, each spacer comprising a first spacer layer and a second spacer layer, the first spacer layer being positioned between the gate stack and the second spacer layer and directly on a sidewall of the gate stack, and the second spacer layer of each spacer having a trapezoidal cross-section and being disposed directly on a sidewall of a respective first spacer layer, wherein at least a portion of at least one of the first spacer layer of each spacer is formed between vertically adjacent semiconductor layers.

20. The semiconductor device of claim 19, wherein a portion of first spacer layer remains on an upper surface of the uppermost spacers and wherein a portion of first spacer layer remains on a lower surface of the lowermost spacers.

* * * * *